United States Patent [19]
Yamate et al.

[11] Patent Number: 6,049,102
[45] Date of Patent: Apr. 11, 2000

[54] SEMICONDUCTOR MEMORY

[75] Inventors: Masahiro Yamate; Yasutaka Kobayashi, both of Tokyo, Japan

[73] Assignee: Oki Electric Industry Co., Ltd., Tokyo, Japan

[21] Appl. No.: 09/135,650

[22] Filed: Aug. 18, 1998

[30] Foreign Application Priority Data

Aug. 29, 1997 [JP] Japan .................................. 9-249344

[51] Int. Cl.[7] .................................................. H01L 27/108
[52] U.S. Cl. .......................................... 257/296; 257/758
[58] Field of Search .................................. 257/296, 750, 257/776, 784, 758; 438/629

[56] References Cited

U.S. PATENT DOCUMENTS

| | | | |
|---|---|---|---|
| 4,905,068 | 2/1990 | Satoh et al. | 257/296 |
| 5,384,287 | 1/1995 | Fukase . | |
| 5,534,463 | 7/1996 | Lee et al. | 438/643 |
| 5,659,201 | 8/1997 | Wollesen | 257/758 |
| 5,684,315 | 11/1997 | Uchiyama et al. | 257/306 |
| 5,696,406 | 12/1997 | Ueno | 257/784 |

FOREIGN PATENT DOCUMENTS

| | | | |
|---|---|---|---|
| 2802141 | 8/1978 | Germany | 257/391 |
| 5-308056 | 11/1993 | Japan . | |
| 6-224312 | 8/1994 | Japan . | |

*Primary Examiner*—Tom Thomas
*Assistant Examiner*—Thien F Tran
*Attorney, Agent, or Firm*—Jones Volentine, LLP

[57] ABSTRACT

In a semiconductor memory having bit lines 10 for data input/output for a memory cell formed at the surface of a semiconductor substrate 1, grooves 19 extending along the direction of the wiring of the bit lines 10 are formed at an oxide film 18 with the bit lines 10 provided connected to the grooves 19. Since the bit lines 10 are made to connect to the grooves 19, the bit lines 10 are firmly secured to the oxide film 18. Thus, the bit lines 10 do not move even when stress is applied to their side surfaces during a heat treatment.

4 Claims, 25 Drawing Sheets

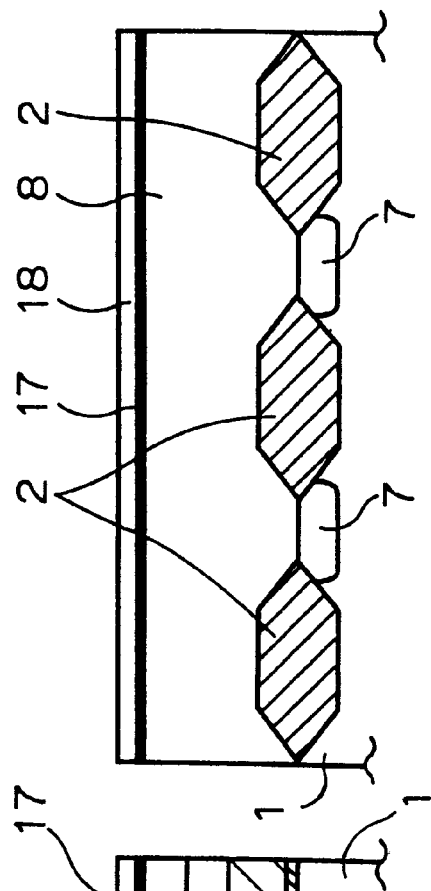
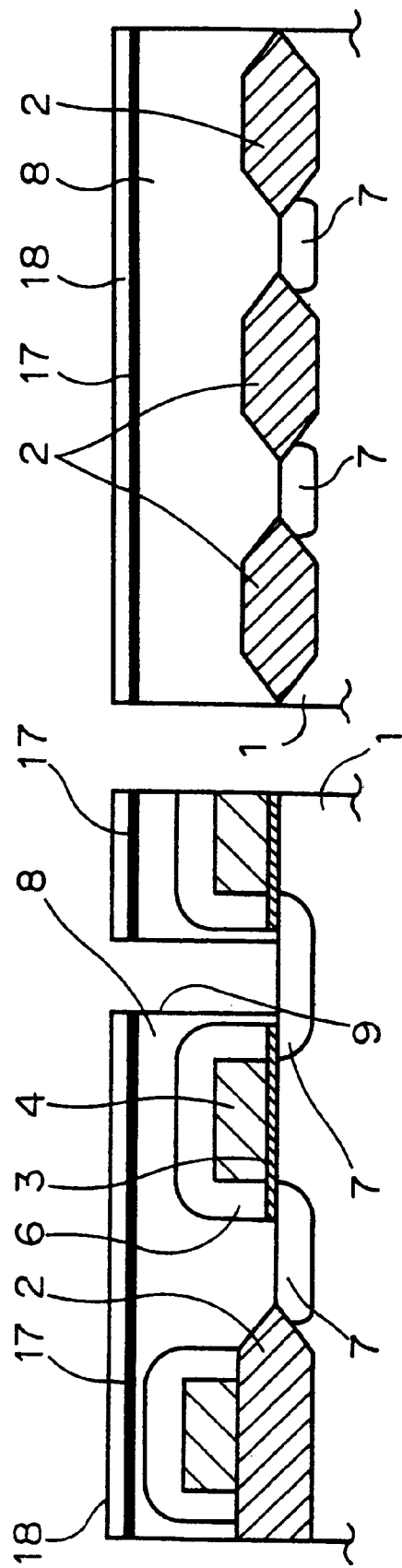
FIG. 1(a)
FIG. 1(b)

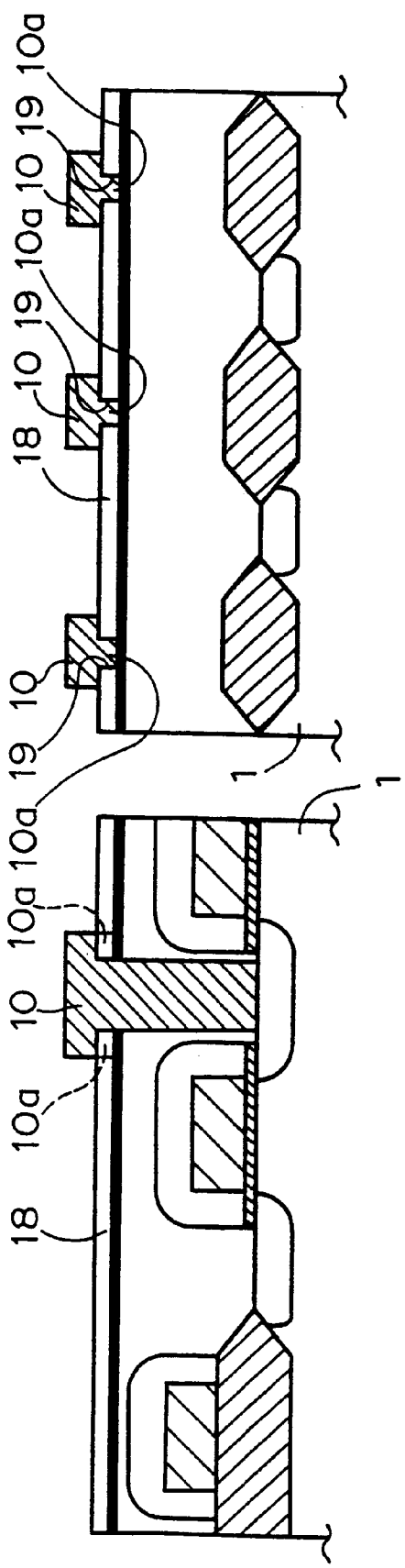

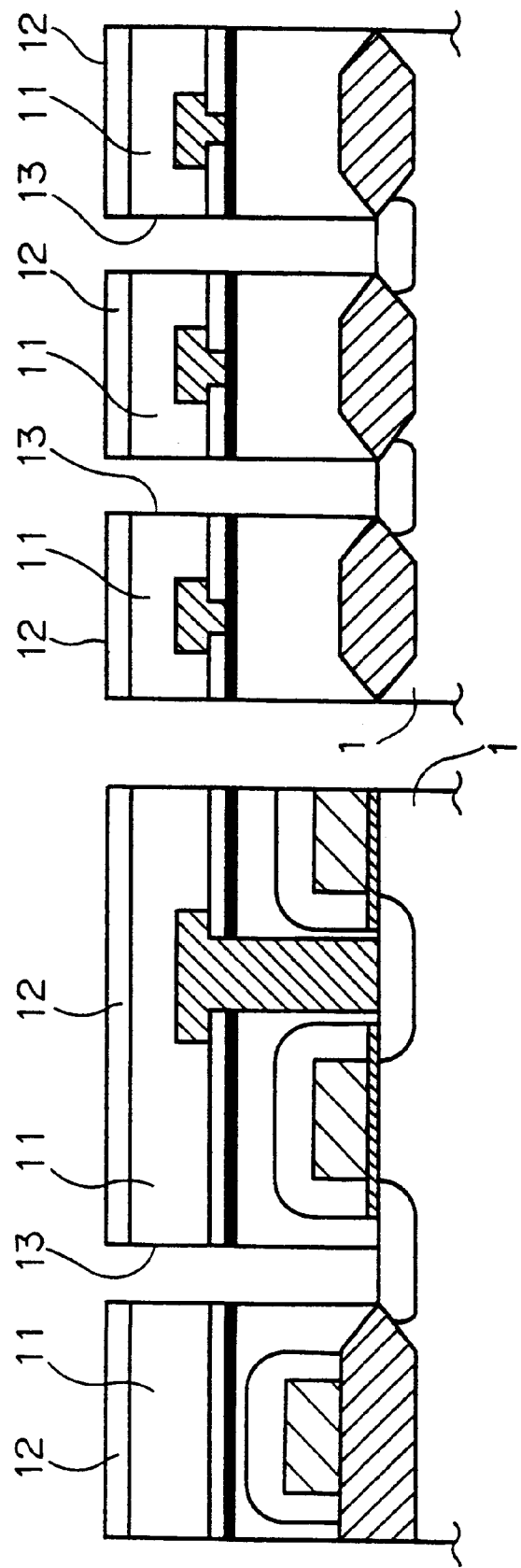

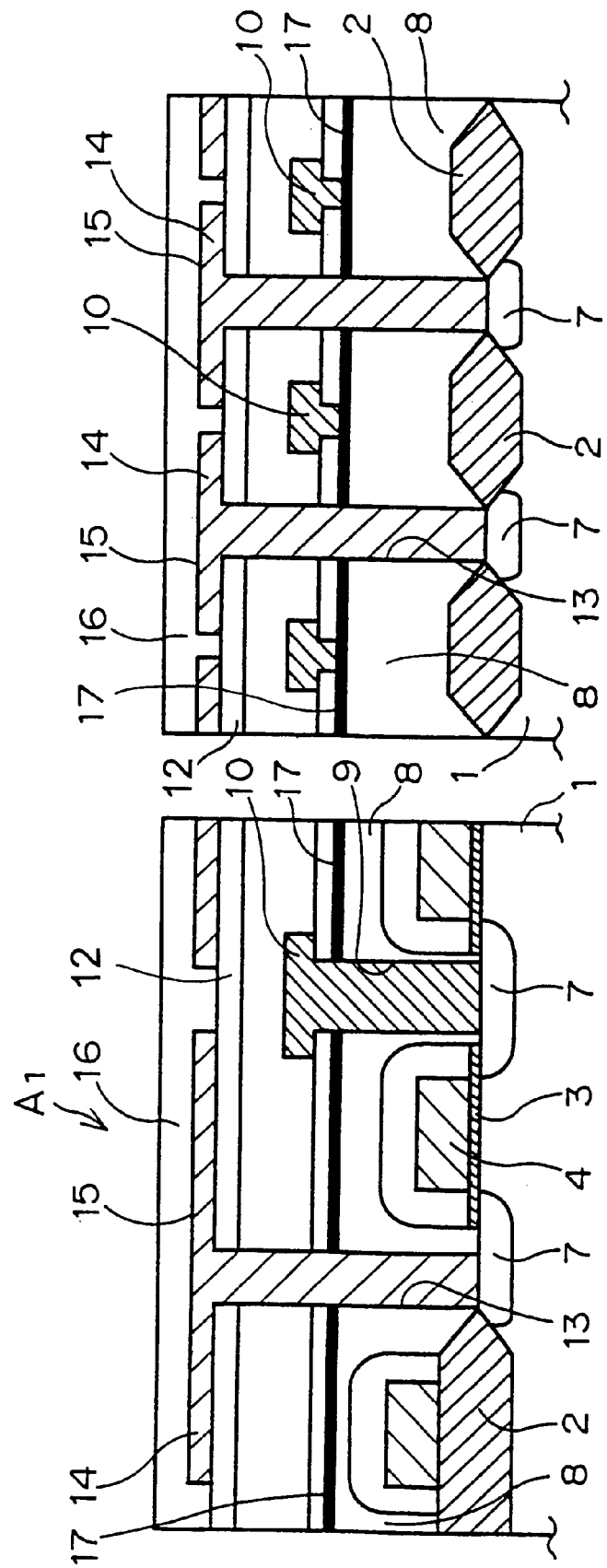

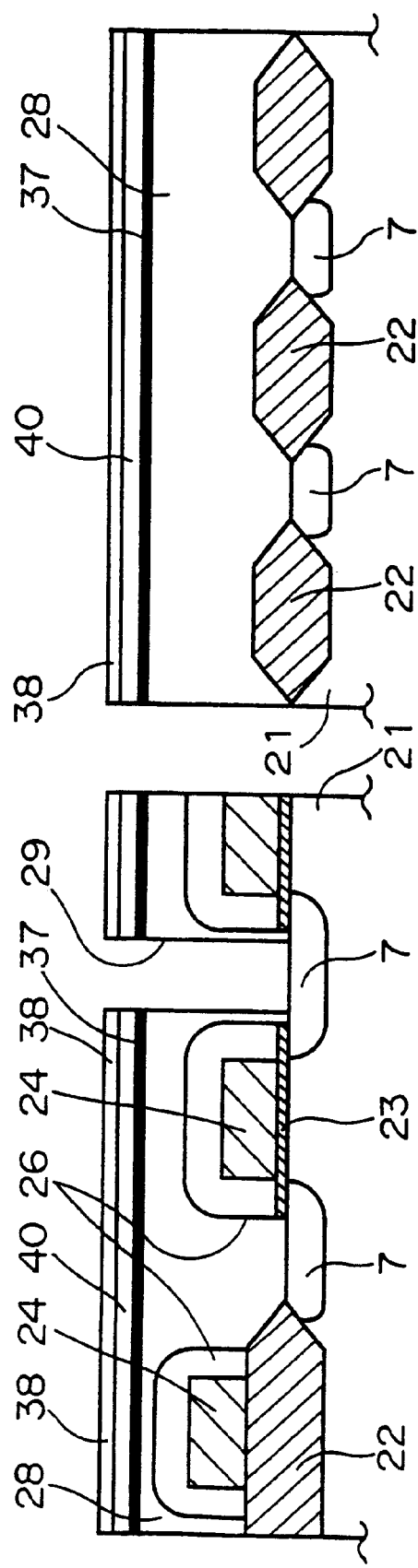

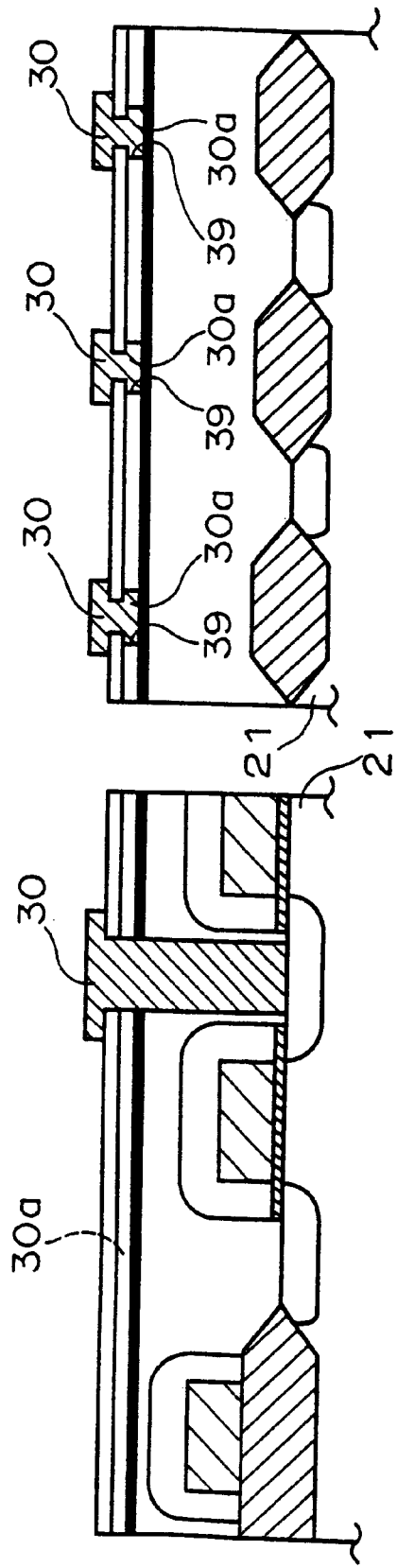

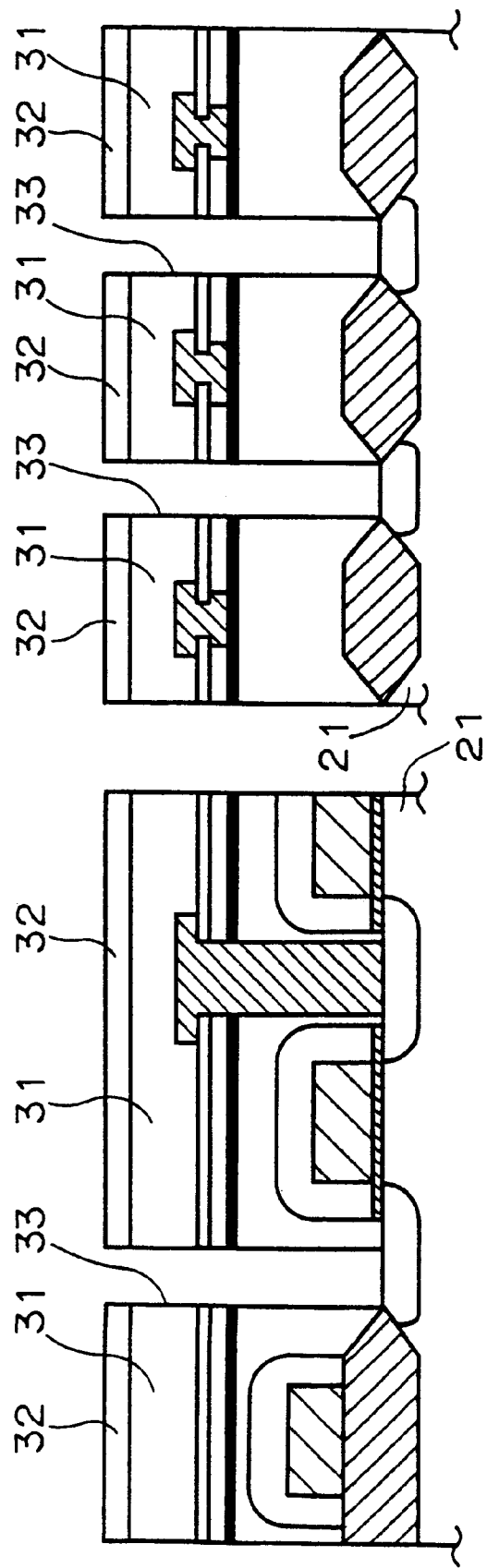

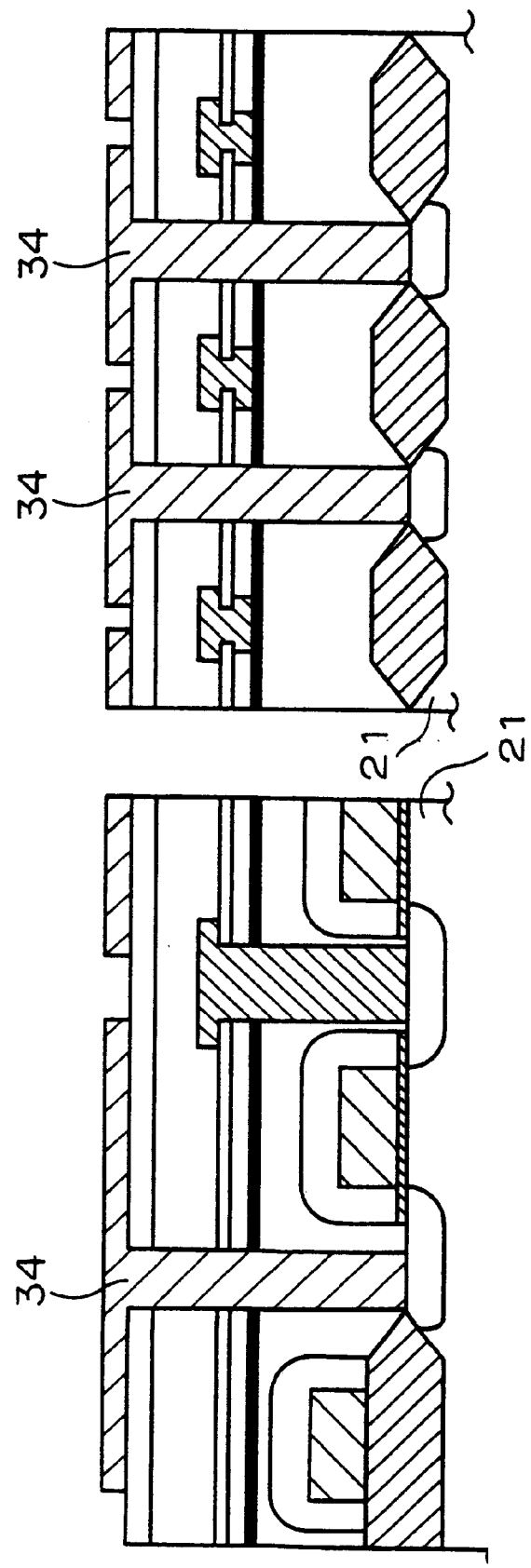

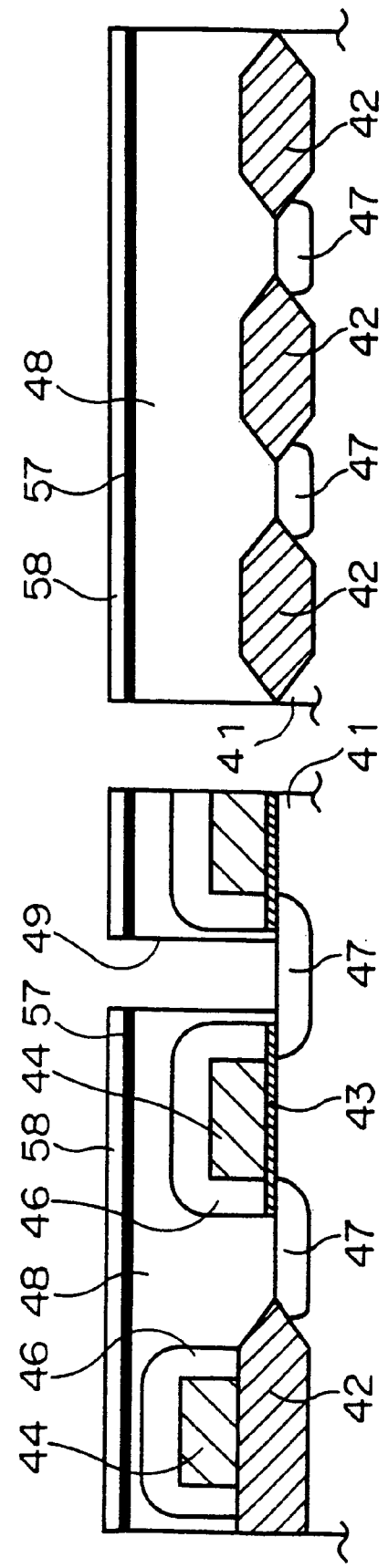

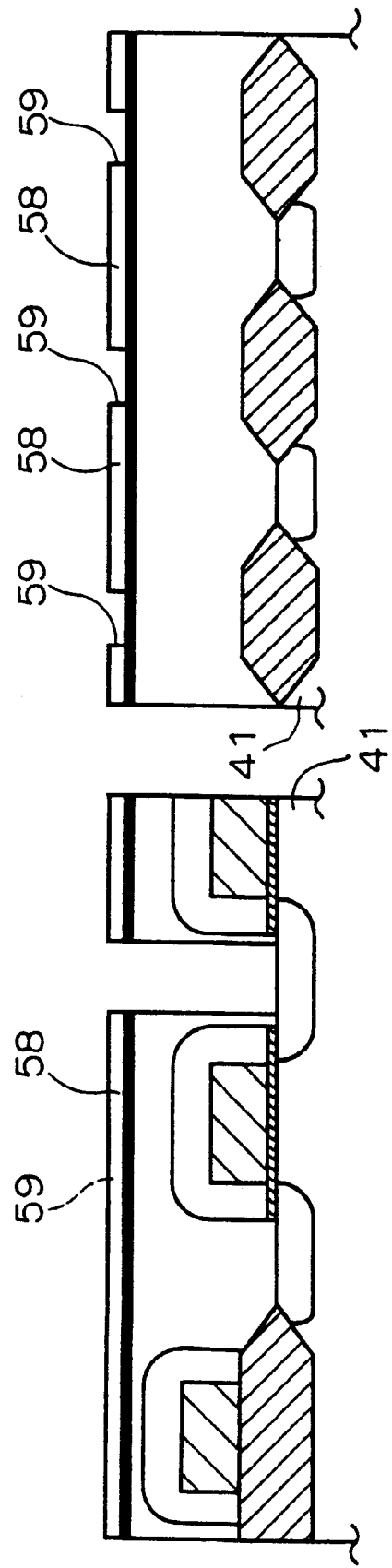

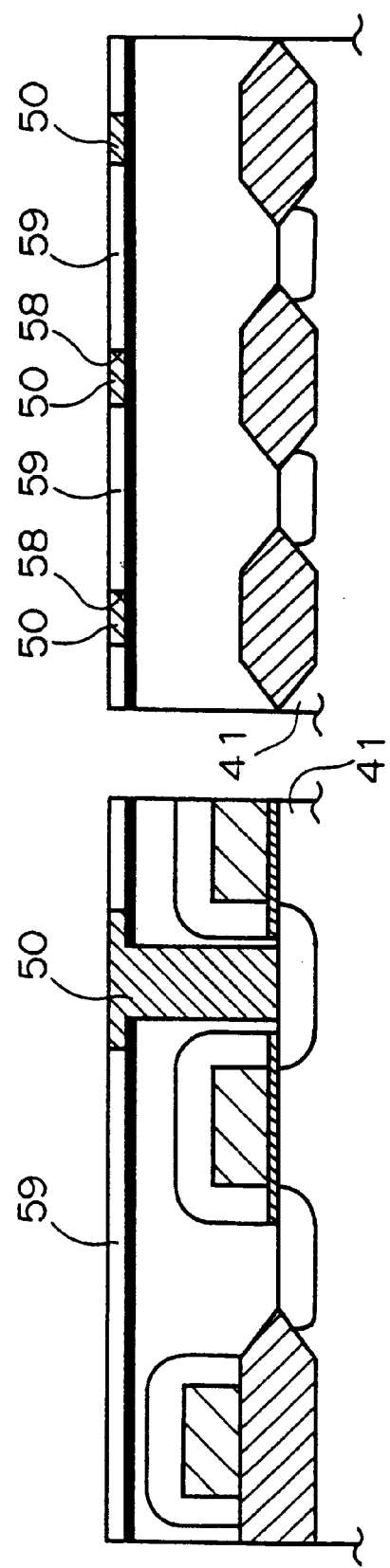

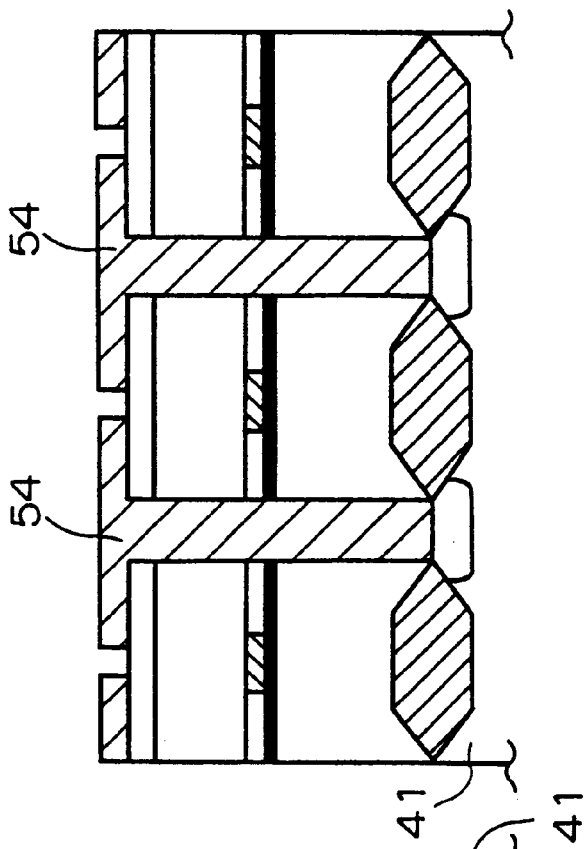
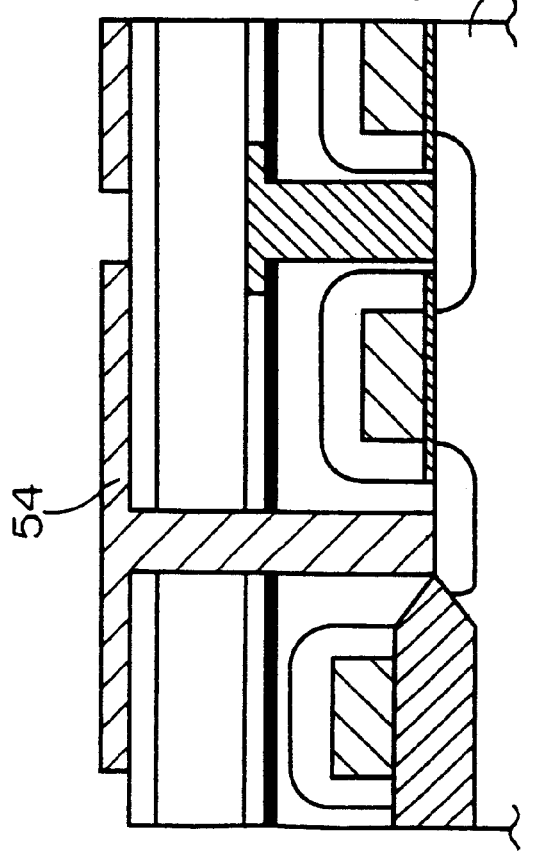
FIG. 17(a)
FIG. 17(b)

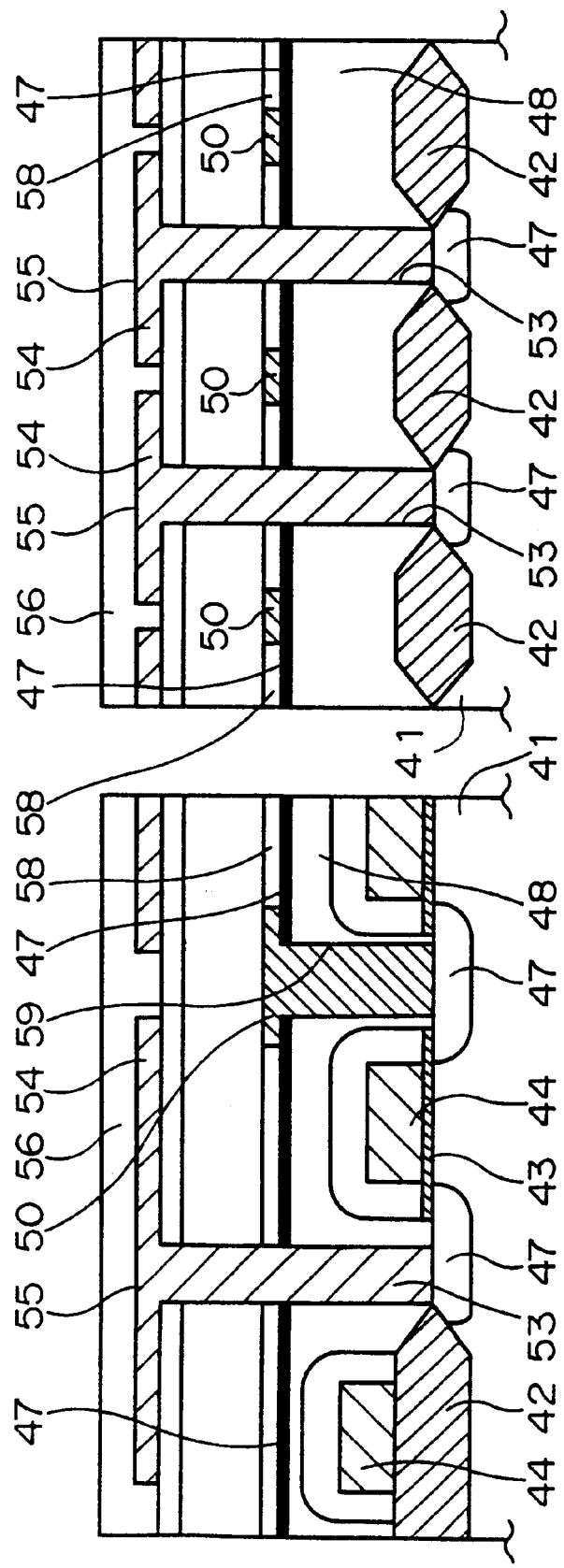

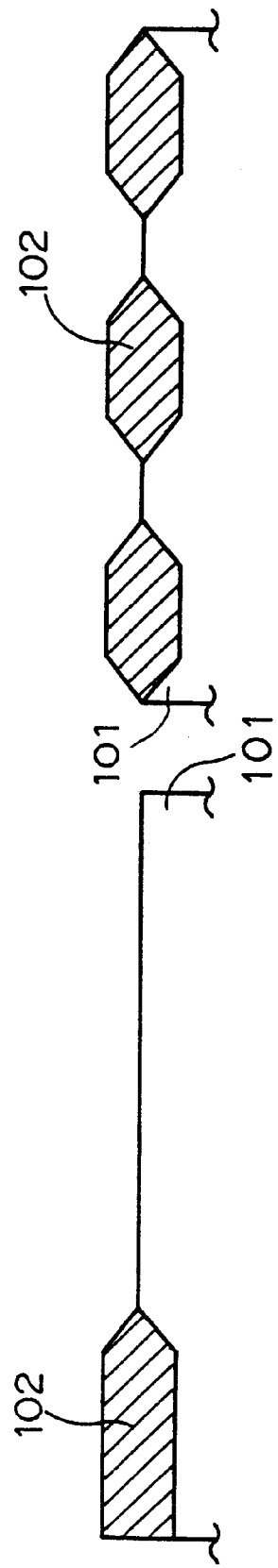

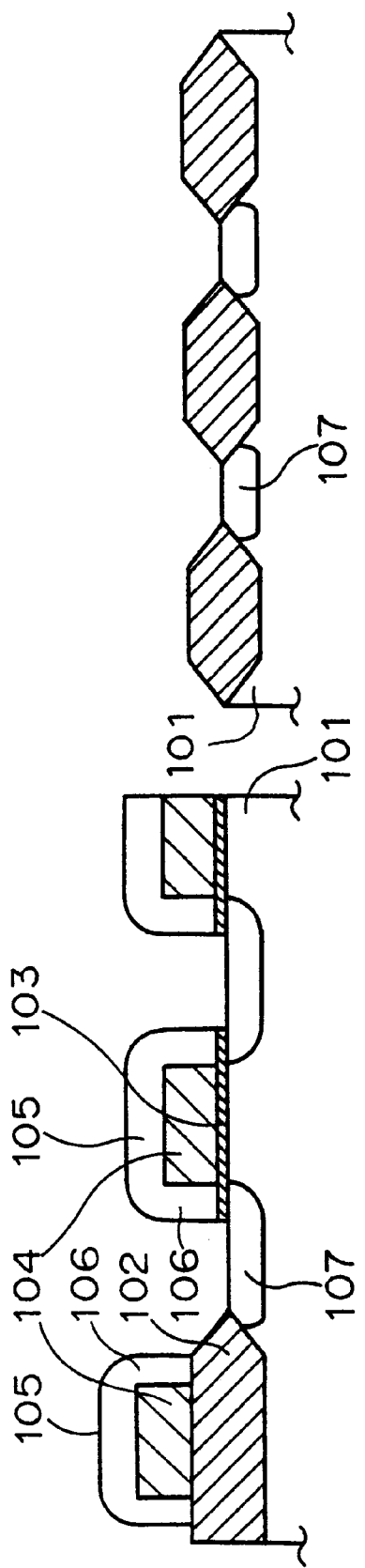

SEMICONDUCTOR MEMORY

BACKGROUND OF THE INVENTION

The present invention relates to a semiconductor memory such as a dynamic random access memory (DRAM) and a method for manufacturing the semiconductor memory.

Today, semiconductor memories are employed in various electronic devices. A DRAM, which is a type of semiconductor memory, performs data write and data read by charging and discharging capacitor portions constituting memory cells. A data write is performed by raising the potential at a word line to turn on a transistor and charge a capacitor portion with a potential corresponding to the data from a selected bit line. A data read is performed by detecting the potential that is effected at the bit line by the charge stored at a capacitor portion when a transistor is turned on. Such DRAMs are widely employed as main storage devices in computers and OA apparatuses since their relatively simple structure achieves higher integration and larger capacity with ease.

Now, the structure of stacked (laminated) type memory cells in the prior art is described by referring to its manufacturing method presented in FIGS. 19–25. It is to be noted that in FIGS. 19–25, the figures (a)on the left-hand side each show the structure of the memory cell in a cross section intersecting the memory cell orthogonal to the direction of the wiring of word lines 104, whereas the figures (b) on the right-hand side each show the structure of the memory cell in a cross section intersecting the memory cell orthogonal to the direction of the wiring of bit lines 110.

First, as shown in FIGS. 19(a) and (b), a field oxide film 102 is formed at the surface of a semiconductor substrate (silicon substrate) 101. Then, as shown in FIGS. 20(a) and (b), a gate oxide film 103 is formed. Next, word lines 104 are formed by laminating polysilicon on the field oxide film 102 and performing patterning through photolithography/etching. After this, a CVD oxide film 105 is formed to cover the word lines 104, a thick oxide film is deposited through the LP-CVD method and etching is performed employing the RIE method to form side walls 106. Then, a diffusion layer 107 is formed through ion implantation.

Next, as illustrated in FIGS. 21(a) and (b), an oxide film 108 containing phosphorus and boron is deposited through the CVD method to constitute a first insulating film, and after implementing a flow through a heat treatment, a bit contact 109 is opened through photolithography/etching. Then, polysilicon is deposited and through photolithography/etching the bit lines 110 are formed, as illustrated in FIGS. 22(a) and (b). After this, as illustrated in FIGS. 23(a) and (b), an oxide film 111 containing phosphorus and boron is deposited through the CVD method to constitute a second insulating film, and a flow is implemented through a heat treatment.

Next, a thin capacitor insulating film for a capacitor that is to be formed during a subsequent step is formed, and after depositing a thick oxide film 112, which is required to assure a sufficient capacitor capacity through the LP-CVD method, a cell 113 is opened through photolithography/etching. Then, as illustrated in FIGS. 24(a) and (b), a storage electrode 114 to constitute the capacitor portion is formed, and then, as illustrated in FIGS. 25(a) and (b), the essential portion of the memory cell is completed by sequentially forming a capacitor insulating film 115 constituted of a thin nitride film and a cell plate electrode 116.

A heat treatment is implemented for purposes of activating impurities and the like when forming capacitor portions at a memory cells in this manner. During this step, if a stressed film is present on the oxide film 111 containing phosphorus and boron and having a degree of fluidity, the oxide film 111 will be caused to flow by the thermal stress. As a result, the bit lines 110, too, will be subject to the stress applied from their side surfaces, which raises a concern that the pattern, too, maybe caused to move together at locations where the wiring length is great. If the pattern of the bit lines 110 moves in this manner, the semiconductor memory will not operate correctly.

If, on the other hand, there is no stressed film present on the oxide film 111, the film thickness of the capacitor insulating film 115 cannot be reduced and, consequently, the required capacitor capacity for ensuring that the semiconductor memory operates correctly cannot be fully obtained. A stressed film must be provided on the oxide film 111 in order to reduce the film thickness of the capacitor insulating film 115.

SUMMARY OF THE INVENTION

An object of the present invention, which has been completed by addressing the problems of semiconductor memories and the manufacturing methods thereof in the prior art discussed above, is to provide a new and improved semiconductor memory in which bit lines can be firmly secured to an oxide film and, as a result, even when a film with fluidity is provided on the bit lines, there is no likelihood of the bit lines moving during the heat treatment step so that a high yield is achieved and a manufacturing method thereof.

Another object of the present invention is to provide a new and improved semiconductor memory in which, with bit lines firmly secured to the oxide film, a stressed film is provided on the oxide film to make it possible to reduce the film thickness of the capacitor insulating film so that a memory cell with a greatly improved capacitor capacity can be formed and a manufacturing method thereof.

In order to achieve the objects described above, in a first aspect of the present invention, a semiconductor memory having bit lines for implementing data input/output for a memory cell formed at the surface of a semiconductor substrate, which is characterized in that grooves extending along the direction of the wiring of the bit lines are formed at an oxide film laminated on the semiconductor substrate and that the bit lines are connected to the grooves.

In this semiconductor memory, since the bit lines are connected to the grooves formed at the oxide film, a state is achieved in which the bit lines are firmly secured to the oxide film. Thus, the bit lines do not move even when stress is applied to the side surfaces of the bit lines.

In this semiconductor memory, the cross section of the semiconductor memory orthogonal to the direction of the wiring of the bit lines may achieve a <T> shape, a <I> shape or it may be identical to the cross sectional shape of the grooves.

In addition, in a second aspect of the present invention, a method for manufacturing a semiconductor memory comprising a step for forming bit lines on an oxide film laminated on a semiconductor substrate and a step for forming capacitor portions, which further includes a step for forming in advance grooves extending along the direction of the wiring of the bit lines in anticipated areas for bit line formation on the oxide film and a step for forming the bit lines by connecting them to the grooves, is provided.

By adopting this method for manufacturing a semiconductor memory, a semiconductor memory with its bit lines firmly secured to the oxide film to preclude any concerns that the bit lines will move, can be manufactured. In addition, the step for forming the grooves may include a step for etching the oxide film. In that case, the oxide film may adopt a structure achieved by laminating a plurality of oxide film portions having varying etching rates so that indentations and projections are formed at the inner side surfaces of the grooves through the step for etching the oxide film. Furthermore, the step for forming the bit lines may include a step for depositing a conductor and a step for etching the conductor to achieve a desired shape.

Moreover, in the semiconductor memory manufactured through this manufacturing method, its cross section orthogonal to the direction of the wiring of the bit lines may achieve, for instance, a <T> shape or a <I> shape or it may be shaped identical to the shape of the cross section of the grooves.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

FIGS. 1(a)–1(b) illustrates the method for manufacturing a memory cell in a first embodiment of the present invention;

FIGS. 3(a)–3(b) illustrates the method for manufacturing a memory cell in the first embodiment of the present invention;

FIGS. 4(a)–4(b) illustrates the method for manufacturing a memory cell in the first embodiment of the present invention;

FIGS. 6(a)–6(b) illustrates the method for manufacturing a memory cell in the first embodiment of the present invention;

FIGS. 7(a)–7(b) illustrates the method for manufacturing a memory cell in a second embodiment of the present invention;

FIGS. 9(a)–9(b) illustrates the method for manufacturing a memory cell in the second embodiment of the present invention;

FIGS. 10(a)–10(b) illustrates the method for manufacturing a memory cell in the second embodiment of the present invention;

FIGS. 11(a)–11(b) illustrates the method for manufacturing a memory cell in the second embodiment of the present invention;

FIGS. 13(a)–13(b) illustrates the method for manufacturing a memory cell in a third embodiment of the present invention;

FIGS. 14(a)–14(b) illustrates the method for manufacturing a memory cell in the third embodiment of the present invention;

FIGS. 15(a)–15(b) illustrates the method for manufacturing a memory cell in the third embodiment of the present invention;

FIGS. 17(a)–17(b) illustrates the method for manufacturing a memory cell in the third embodiment of the present invention;

FIGS. 18(a)–18(b) illustrates the method for manufacturing a memory cell in the third embodiment of the present invention;

FIGS. 19(a)–19(b) illustrates a method for manufacturing a memory cell in the prior art;

FIGS. 20(a)–20(b) illustrates a method for manufacturing a memory cell in the prior art;

DETAILED DESCRIPTION OF THE PREFERRED EMBODIMENTS

Figures 2A, 2B:
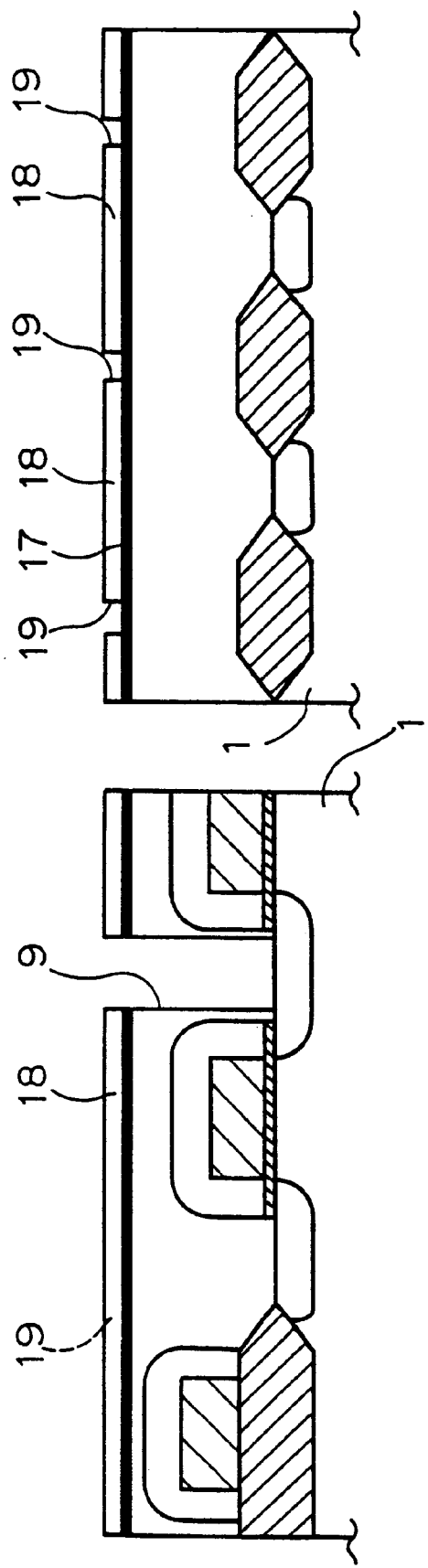
FIGS. 2(a)–2(b) illustrates the method for manufacturing a memory cell in the first embodiment of the present invention.

The following is an explanation of the present invention in reference to its preferred embodiments each achieved as a stacked (laminated) type memory cell. FIGS. 1–6 illustrate steps for manufacturing a memory cell in the first embodiment of the present invention, presented in the manufacturing sequence. It is to be noted that in FIGS. 1–6, the figures (a) on the left-hand side each illustrate the structure of the memory cell in the first embodiment in a cross section orthogonal to the direction of the wiring of word lines 4, whereas the figures (b) on the right-hand side each illustrate the structure of the memory cell in cross section orthogonal to the direction of the wiring of bit lines 10.

First, as illustrated in FIG. 1, a field oxide film 2 is formed on a semiconductor substrate (a P-type silicon substrate) 1 through a selective oxidation method to provide isolation areas for manufacturing a memory cell on the semiconductor substrate 1. The field oxide film 2 is formed to have a thickness of 1000–8000 angstrom by thermally oxidizing a surface of the semiconductor substrate 1 in a wet atmosphere at a temperature of, for instance, 1000 degrees centigrade. In addition, after forming a gate oxide film 3 having a thickness of 50–200 angstrom through thermal oxidation, polysilicon is deposited over a thickness of 1000–3000 angstrom through the LP-CVD method and impurities such as phosphorus are doped over 1–6 E20 $cm^{-3}$ through thermal diffusion. Next, an oxide film is grown on top of it to a thickness of 1000–3000 angstrom through the CVD method, and the word lines 4 are formed by processing and patterning the oxide film and the polysilicon through photolithography/etching. Then, an oxide film is grown to a thickness of 500–3000 angstrom through the LP-CVD method and side walls 6 are formed by etching the oxide film through the RIE method. After this, phosphorus or arsenic (As) is doped at approximately 1 E14–16 $cm^{-2}$ at an energy level of 10–100 KeV through ion implantation to form a diffusion layer 7. Next, through the CVD, a first oxide film (a first oxide film having fluidity) 8 containing phosphorus and boron is grown to a thickness of 3000–8000 angstrom.

At the next step, after a reflow is performed on the oxide film in a nitrogen atmosphere at a temperature ranging from 800–1000 degrees centigrade, an nitride film 17 which is to constitute an etching stopper is grown to a thickness of 100–1000 angstrom through the LP-CVD method. Then, an oxide film (a first oxide film without fluidity) is grown to a thickness of 500–1000 angstrom through the LP-CVD method and a bit contact 9 is opened through photolithography/etching.

Next, grooves 19 extending along the direction of the wiring of the bit lines 10 are formed in anticipated formation areas for the bit lines 10 on the oxide film 18. (The grooves 19 appear in FIG. 2(*b*) on the right-hand side.) It is to be noted that in the first embodiment, the grooves 19 are constituted by forming a mask having the pattern of the grooves 19 in anticipated formation areas for a bit lines 10 on the oxide film 18 and etching the oxide film 18 using the nitride film 17 as a stopper.

In the next step, a wiring material constituted of polysilicon is deposited over a thickness of 500–3000 angstrom through the CVD method, so that the grooves 19 are filled with the polysilicon. Then, impurities such as phosphorus are doped at approximately 1–6 E20 $cm^{-3}$ to achieve conductivity. This may be implemented through ion implantation or through thermal diffusion. Next, a mask of the wiring pattern is formed on the polysilicon in such a manner that the wiring width is larger than the width of the grooves 19, and the bit lines 10 are formed by etching the polysilicon. It is to be noted that the shape of the mask should ensure that the wiring pattern having a larger width than the grooves 19 is formed over the grooves 19. Through such photolithography/etching, the shape of the cross section of the bit lines 10 orthogonal to the direction of the wiring achieves a <T>, and with a lower portion 10*a* of each bit line 10 connected to a groove 19, the bit lines 10 become firmly secured to the oxide film 18.

Next, as illustrated in FIG. 4, a second oxide film (a second oxide film having fluidity) 11 is grown to a thickness of 3000–8000 angstrom through CVD, and after executing a reflow in a nitrogen atmosphere at a temperature of 800–1000 degrees centigrade, an oxide film 12 is grown to a thickness of approximately 1000 angstrom through the LP-CVD method. This oxide film 12 is required for forming a thin capacitor insulating film 15 which is to be formed in a subsequent step to assure a sufficient capacitor capacity. Next, cell contacts 13 are opened through photolithography/etching.

Figure 5A:
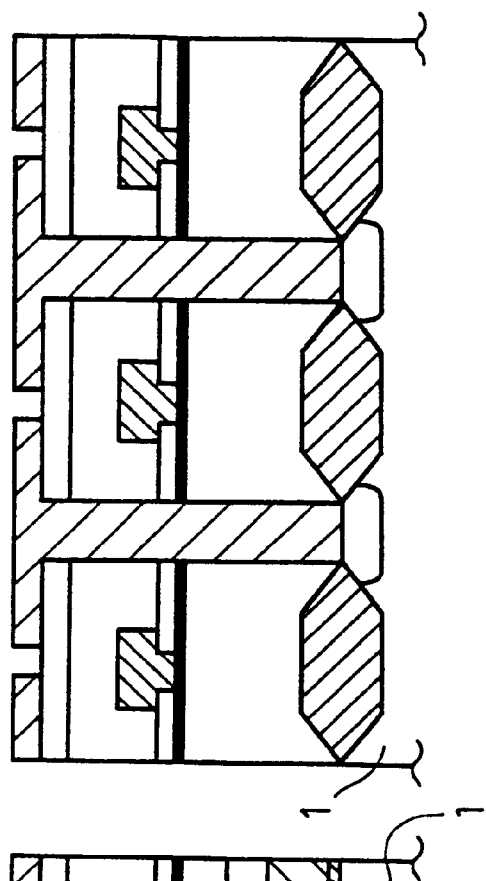
FIGS. 5(a)–5(b) illustrates the method for manufacturing a memory cell in the first embodiment of the present invention.
Figure 5B:
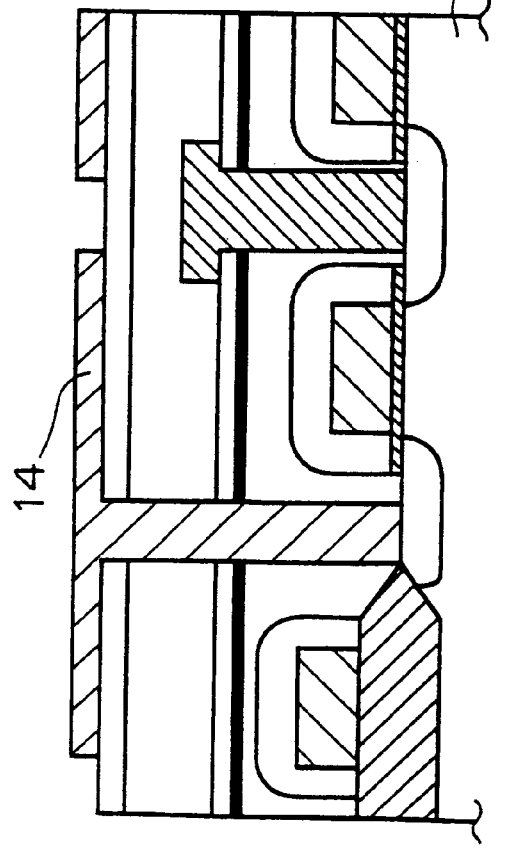

Then, as illustrated in FIG. 5, an electrode material constituted of polysilicon is grown over a thickness of approximately 1000–10000 angstrom through the LP-CVD method, and phosphorus is doped at approximately 1–6 E20 $cm^{-3}$ through ion implantation or thermal diffusion to achieve conductivity. Then, photolithography/etching is performed to form storage electrodes 14. Next, a nitride film which is to constitute the capacitor insulating film 15 is grown to a thickness of approximately 40–60 angstrom through the LP-CVD method. This capacitor insulating film 15 is formed to have a small thickness to assure a sufficient capacitor capacity. In the next step, an electrode material constituted of polysilicon is formed, impurities are doped at approximately 1–6 E20 $cm^{-3}$ to achieve conductivity and cell plate electrode 16 is formed through photolithography/etching. Thus, a memory cell Al of the semiconductor memory in the first embodiment is manufactured.

In the memory cell A, manufactured through the steps described above, the field oxide film 2 is formed at the front surface of the semiconductor substrate 1 to achieve a state in which it is electrically isolated from other adjacent cells. The word lines 4 are provided via the gate oxide film 3. The diffusion layer 7 is present at both sides of each word line 4 (transistor) and a bit line 10 is connected to the diffusion layer 7 at one side via a bit contact 9. The word lines 4 and the bit lines 10 are electrically isolated from each other by the oxide films 8, 17 and 18. A cross section of the bit lines 10 orthogonal to the direction of their wiring achieves a <T> shape, with the lower portions 10a of the bit lines 10 connected to the grooves 19 formed at the oxide film 18. Each storage electrode 14 is connected to the diffusion layer 7 at the other side via a cell contact 13. The storage electrode 14 forms a capacity between itself and the cell plate electrode 16 via the thin insulating film 15.

In the semiconductor memory in the first embodiment, since the lower portions 10*a* of the bit lines 10 achieving a <T> shape are connected to the grooves 19 formed at the oxide film 18, the bit lines 10 are firmly secured to the oxide film 18. Thus, the bit lines 10 do not move even if stress is applied to the side surfaces of the bit lines 10 due to thermal stress occurring when, for instance, a reflow is performed on the second oxide film 11 in a nitrogen atmosphere at a temperature of 800–1000 degrees centigrade.

Now, FIGS. 7–12 illustrate the steps for manufacturing a memory cell in the second embodiment of the present invention through the manufacturing sequence. It is to be noted that in each of FIGS. 7–12, too, the figures (a) on the left-hand side illustrates the structure of the memory cell in the second embodiment in a cross section orthogonal to the direction of the wiring of word lines 24, whereas the figures (b) on the right-hand side illustrates the structure of the same memory cell in across section orthogonal to the direction of the wiring of bit lines 30.

First, as illustrated in FIG. 7(*a*) (*b*) a field oxide film 22 is formed on a semiconductor substrate 21 to provide isolation areas for the memory cell, and then a gate oxide film 23 is formed. In the following step, polysilicon is deposited, impurities are doped and word lines 24 are formed through photolithography/etching. Then, side walls 26 are formed. After this, a diffusion layer 27 is formed, and then a first oxide film (a first oxide film having fluidity) 28 is grown. It is to be noted that the steps taken so far are identical to those implemented in the first embodiment explained earlier in reference to FIGS. 1–6.

Next, a reflow is performed on the oxide film 28 in a nitrogen atmosphere at a temperature of 800–1000 degrees centigrade, and then a nitride film 37 is grown to a thickness of 100–1000 angstrom through the LP-CVD method. In the second embodiment, an PSG (Phospho-Silicate- Glass oxide) film 40 is grown to a thickness of 500–1000 angstrom through the CVD method and, furthermore, an NSG oxide film 38 having an etching rate different from the etching rate of the PSG oxide film 40 is grown to a thickness of 500–1000 angstrom through the LP-CVD method in the next step. After this, a bit contact 29 is opened through photolithography/etching.

Figures 8A, 8B:
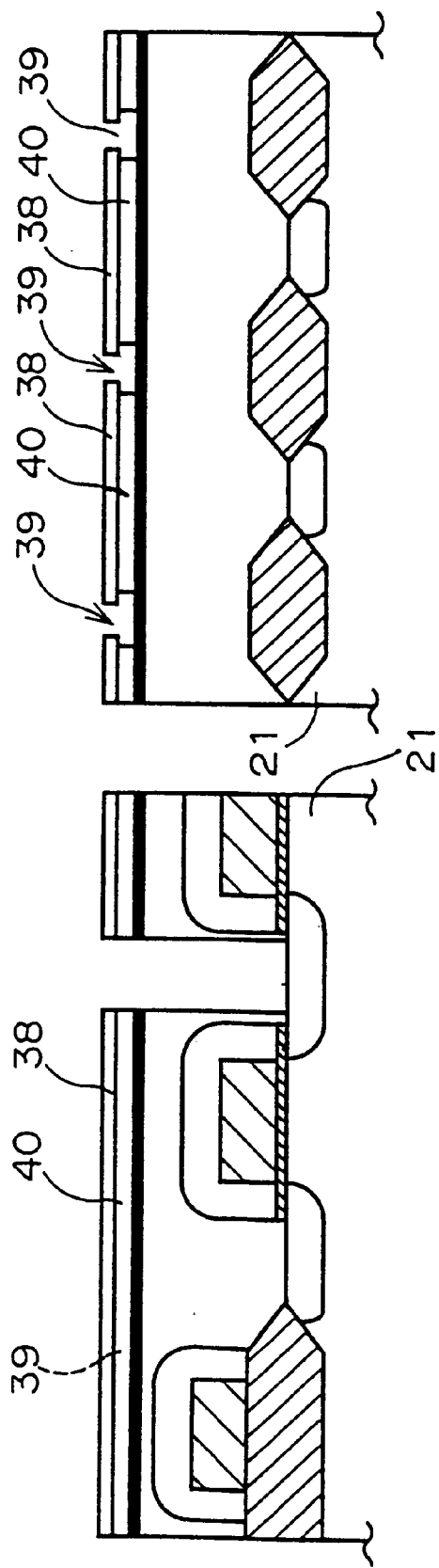
FIGS. 8(a)–8(b) illustrates the method for manufacturing a memory cell in the second embodiment of the present invention.
Figure 12A:
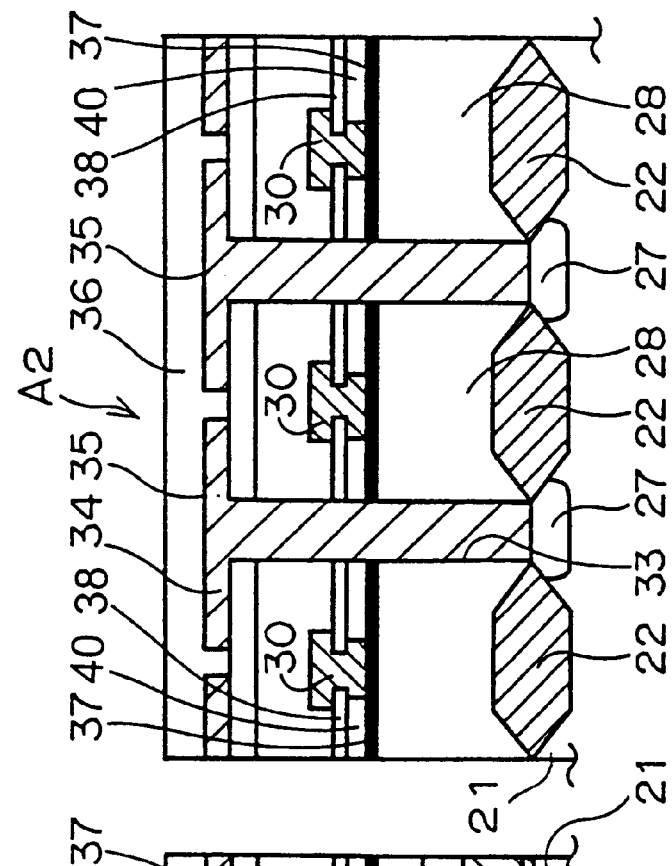
FIGS. 12(a)–12(b) illustrates the method for manufacturing a memory cell in the second embodiment of the present invention.
Figure 12B:
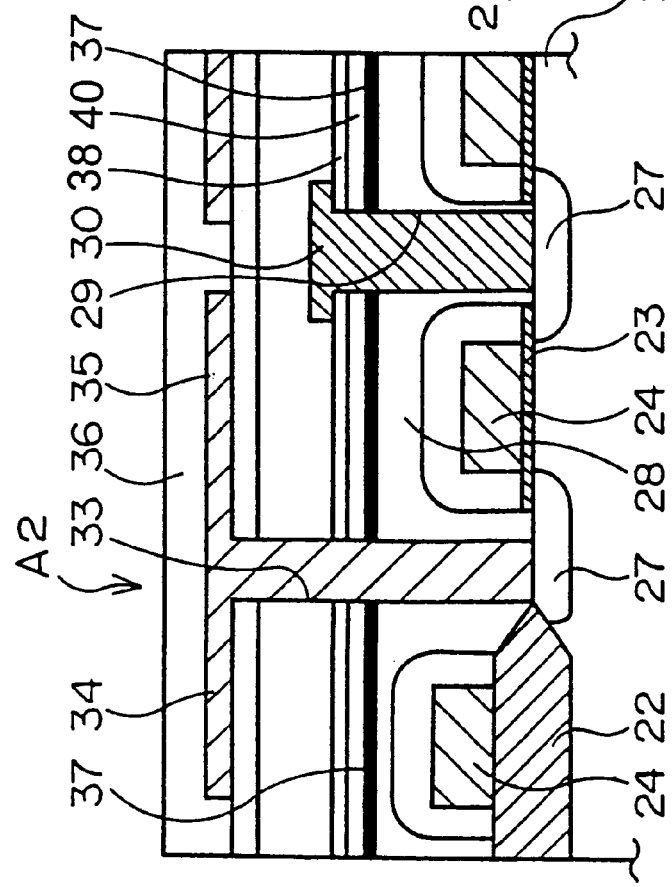

Next, as illustrated in FIG. 8, grooves 39 extending along the direction of the wiring of the bit lines 30 are formed in anticipated formation areas for the bit lines 30 on the oxide films 38 and 40 (the grooves 39 appear in FIG. 8(*b*) on the right-hand side). It is to be noted that in the second embodiment, the grooves 39 are constituted by forming a mask having the pattern of grooves 39 in the anticipated formation area of the bit lines 30 on the NSG oxide film 38 and wet-etching the oxide films 38 and 40 using, for instance, dilute hydrofluoric acid with the nitride film 37 used as a stopper. When wet-etching is performed using dilute hydrofluoric acid, or the like, in this manner, the PSG oxide film 40 is etched over a larger quantity than the NSG oxide film 38 due to the varying etching rates of the PSG oxide film 40 and the NSG oxide film 38. Consequently, as illustrated in FIG. 8(b), indentations and projections are formed at the inner side surfaces of the grooves 39 so that the width of the grooves 39 is larger toward the bottom and smaller toward the top.

Next, a wiring material constituted of polysilicon is deposited over 500–3000 angstrom through the CVD method, with the polysilicon filling the grooves 39. Then, impurities such as phosphorus are doped at approximately 1–6 E20 cm$^{-3}$ to achieve conductivity. This may be implemented through either ion implantation or through thermal diffusion. Next, a mask with a wiring pattern is formed on the polysilicon, ensuring that the wiring width is larger than the width of the upper portions of the grooves 39, the bit lines 30 are formed by etching the polysilicon. This achieves a <I> shape for the cross section of the bit lines 30 orthogonal to the direction of their wiring, as illustrated in FIG. 9(b), and with the lower portions 30(a) of the bit lines 30 connected to the grooves 39, the bit lines 30 become firmly secured to the oxide films 38 and 40. It is to be noted that since the inner side surfaces of the grooves 39 are formed to achieve an indented and projected shape which is wide toward the bottom and narrow toward the top in the second embodiment, as explained earlier, the contact areas over which the lower portions 30a of the bit lines 30 come in contact with the oxide films 38 and 40 are larger compared to those in the first embodiment, thereby even more firmly securing the bit lines 30 to the oxide films 38 and 40.

Next, as illustrated in FIG. 10, a second oxide film 31 containing phosphorus and boron is grown to a thickness of 3000–8000 angstrom through CVD, and after performing a reflow in a nitrogen atmosphere at a temperature of 800–1000 degrees centigrade, an oxide film 32 is grown to a thickness of approximately 1000 angstrom through the LP-CVD method. This oxide film 32 is required in order to thinly form a capacitor insulating film 35 which is to be formed in a subsequent step that is to be detailed later to ensure a sufficient capacitor capacity. Next, cell contacts 33 are opened through photolithography/etching.

Next, as illustrated in FIG. 11, an electrode material constituted of polysilicon is grown to a thickness of approximately 1000–10000 angstrom through the LP-CVD method, and phosphorus is doped at approximately 1–6 E20 cm$^{-3}$ through ion implantation or thermal diffusion to achieve conductivity. Then, through photolithography/etching, storage electrodes 34 are formed. Next, a nitride film which is to constitute the capacitor insulating film 35 is grown to a thickness of approximately 40–60 angstrom through the LP-CVD method. Following this, polysilicon constituting an electrode material is formed, impurities are doped at approximately 1–6 E20 cm$^{-3}$ to achieve conductivity and a cell plate electrode 36 is formed through photolithography/etching. Through this process, a memory cell $A_2$ of the semiconductor memory in the second embodiment is manufactured.

In the memory cell $A_2$ manufactured as described above, the field oxide film 22 is formed on the semiconductor substrate 21 to achieve a state in which the memory cell $A_2$ is electrically isolated from the cells adjacent to it. The word lines 24 are provided via the gate oxide film 23. The diffusion layer 27 is present at both sides of each word line 24 (transistor) with a bit line 30 connected to the diffusion layer 27 at one side via a bit contact 29. The word lines 24 and the bit lines 30 are electrically isolated by the insulating films 28, 37 and 38. The cross section of the bit lines 30 orthogonal to the direction of their wiring achieves a <I> shape with the lower portions 30a of the bit lines 30 connected to the grooves 39 formed at the oxide films 38 and 40. A storage electrode 34 is connected to the diffusion layer 27 at the other side via a cell contact 33. The storage electrodes 34 form a capacity between themselves and the cell plate 36 via the thin insulating film 35.

In the semiconductor memory in the second embodiment, the lower portions 30a of the bit lines 30 with their cross section achieving a <I> are connected to the grooves 39 formed at the oxide films 38 and 40, and the inner side surfaces of the grooves 39 achieve an indented and projected shape with a wide lower portion and a narrow upper portion. Thus, compared to the first embodiment, the contact areas over which the lower portions 30a of the bit line 30 come into contact with the oxide films 38 and 40 are larger, to even more firmly secure the bit lines 30 to the oxide films 38 and 40. As a result, movement of the bit lines 30 can be even more reliably prevented when, for instance, reflowing the second oxide film 31 in a nitrogen atmosphere at a temperature of 800–1000 degrees centigrade.

Next, FIGS. 13–18 illustrate the steps for manufacturing the memory cell in the second embodiment of the present invention through the manufacturing sequence. It is to be noted that in each of the FIGS. 13–18, too, FIG. (a) on the left-hand side illustrates the structure of the memory cell in the third embodiment in a cross section orthogonal to the direction of the wiring of word lines 44, whereas FIG. (b) on the right-hand side illustrates the structure of the same memory cell in a cross section orthogonal to the direction of the wiring of bit lines 50.

First, as illustrated in FIG. 13(a) (b) a field oxide film 42 is formed on a semiconductor substrate 41 to provide isolation areas for the memory cells, and then a gate oxide film 43 is formed. In the following step, polysilicon is deposited, impurities are doped and word lines 44 are formed through photolithography/etching. Then, side walls 46 are formed. After this, a diffusion layer 47 is formed, and then a first oxide film (a first oxide film having fluidity) 48 is grown. It is to be noted that the steps taken so far are identical to those implemented in the first embodiment explained earlier in reference to FIGS. 1–6.

Next, after performing a reflow on the oxide film 48 in a nitrogen atmosphere at a temperature of 800–1000 degrees centigrade, a nitride film 57 which is to constitute an etching stopper is grown to a thickness of 100–1000 angstrom through the LP-CVD method. Then, an NSG oxide film 58 is grown to a thickness of 500–1000 angstrom through the LP-CVD method, and after this, a bit contact 49 is opened through photolithography/etching.

Next, as illustrated in FIG. 14, grooves 59 extending along the direction of the wiring of the bit lines 50 are formed in anticipated formation areas for the bit lines 50 on the oxide film 58 (the grooves 59 appear in FIG. 14(b) on the right-hand side). It is to be noted that in the third embodiment, the grooves 59 are constituted by forming a mask having the pattern of grooves 59 in anticipated formation areas for bit lines 50 on the oxide film 58 and etching the oxide film 58 using the nitride film 57 as a stopper.

In the next step a wiring material constituted of polysilicon is deposited over a thickness of 500–3000 angstrom through the CVD method, so that the grooves 59 are filled with the polysilicon. Then, impurities such as phosphorus are doped at approximately 1–6 E20 cm$^{-3}$ to achieve conductivity. This may be implemented through ion implantation or through thermal diffusion. Then, the polysilicon is etched back to expose the oxide film 58. Thus, the bit lines 50 having a cross sectional shape whereby they are embedded inside the grooves 59 at the oxide film 58 are formed, as illustrated in FIG. 15(*b*). It is to be noted that in the third embodiment, it is not necessary to form a wiring pattern mask for the formation of the bit lines 50.

Figures 16A, 16B:
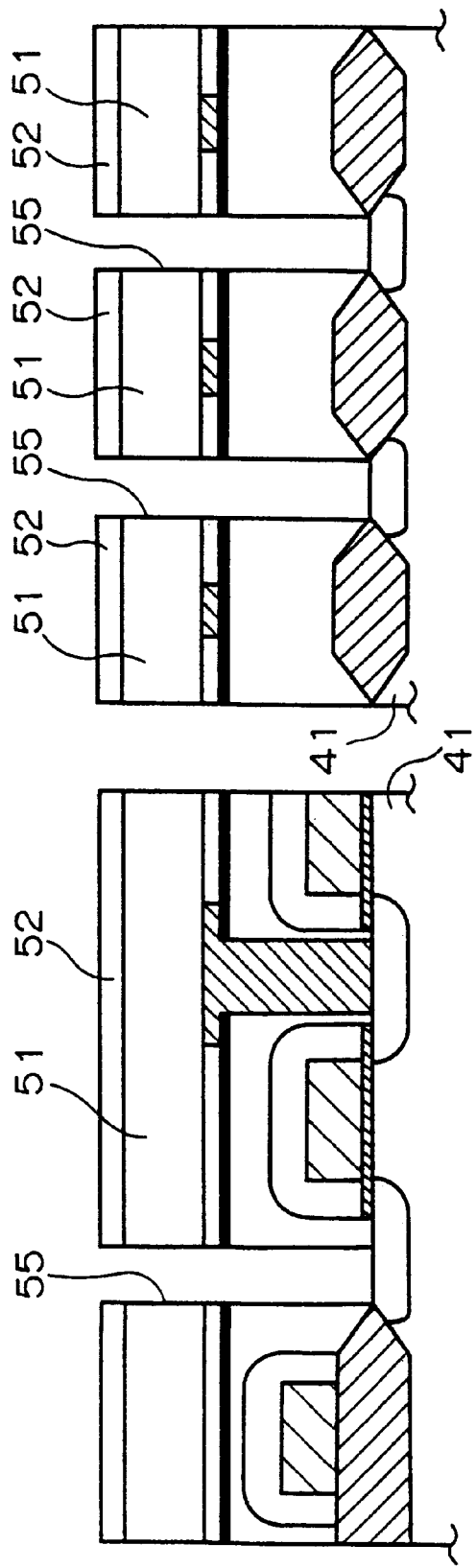
FIGS. 16(a)–16(b) illustrates the method for manufacturing a memory cell in the third embodiment of the present invention.
Figure 21B:
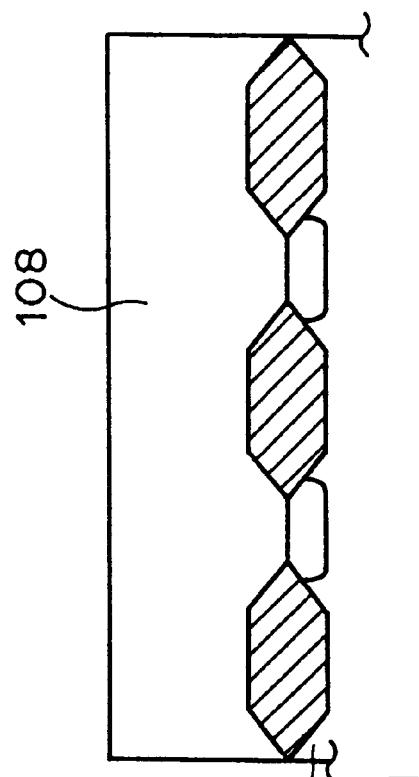
FIGS. 21(a)–21(b) illustrates a method for manufacturing a memory cell in the prior art.
Figure 21A:
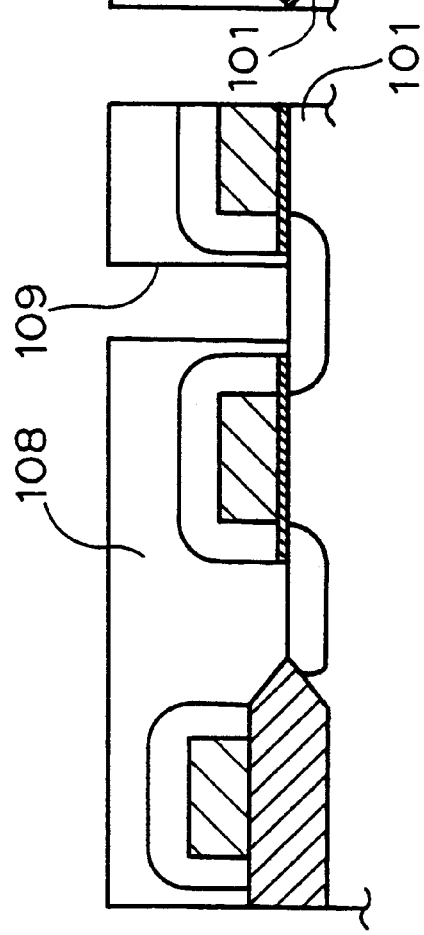
Figures 22A, 22B:
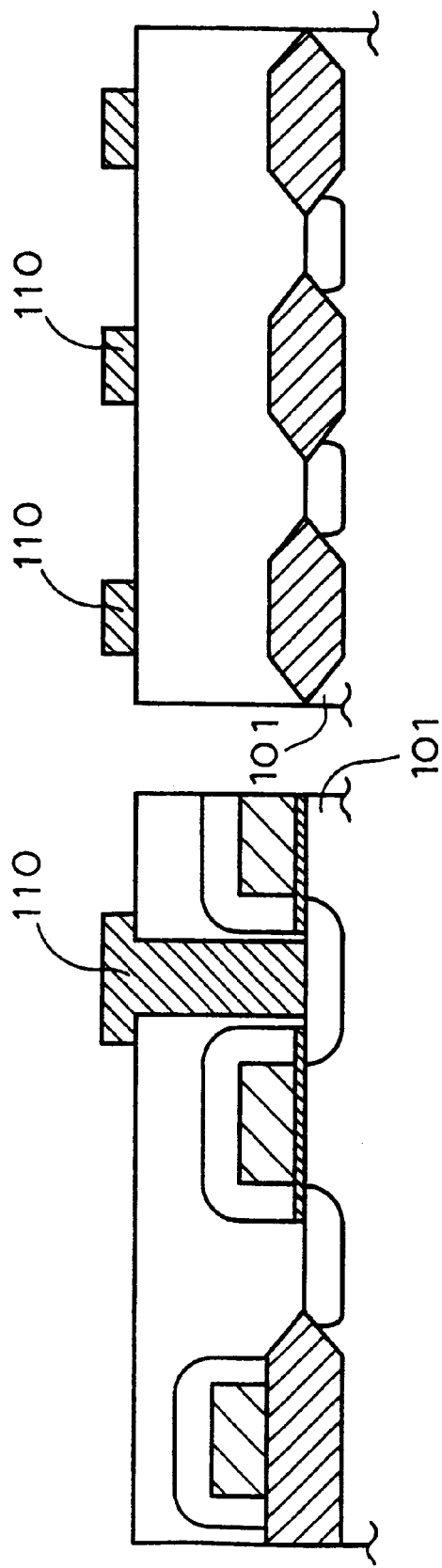
FIGS. 22(a)–22(b) illustrates a method for manufacturing a memory cell in the prior art.
Figure 23A:
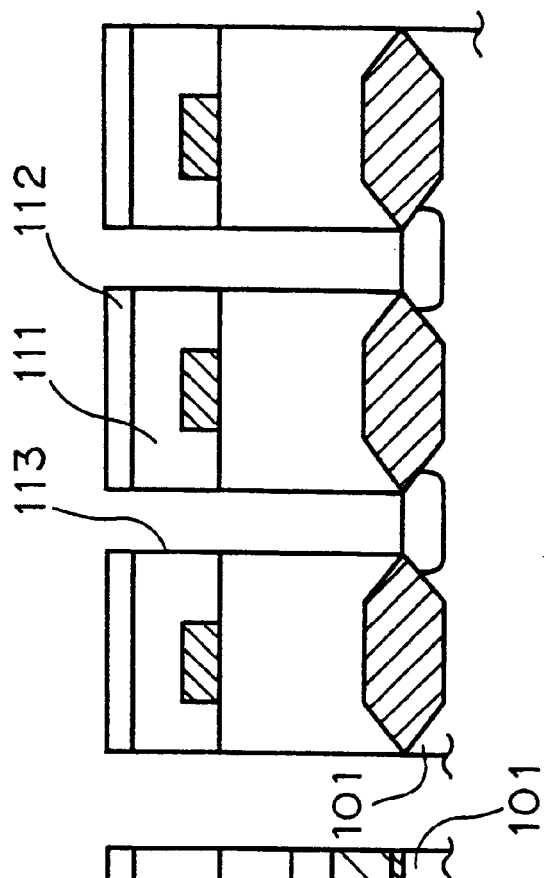
FIGS. 23(a)–23(b) illustrates a method for manufacturing a memory cell in the prior art.
Figure 23B:
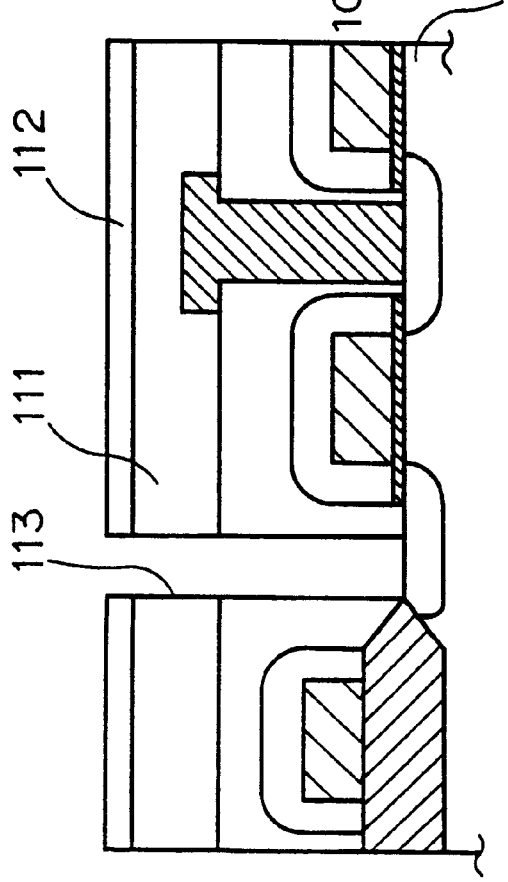
Figure 24A:
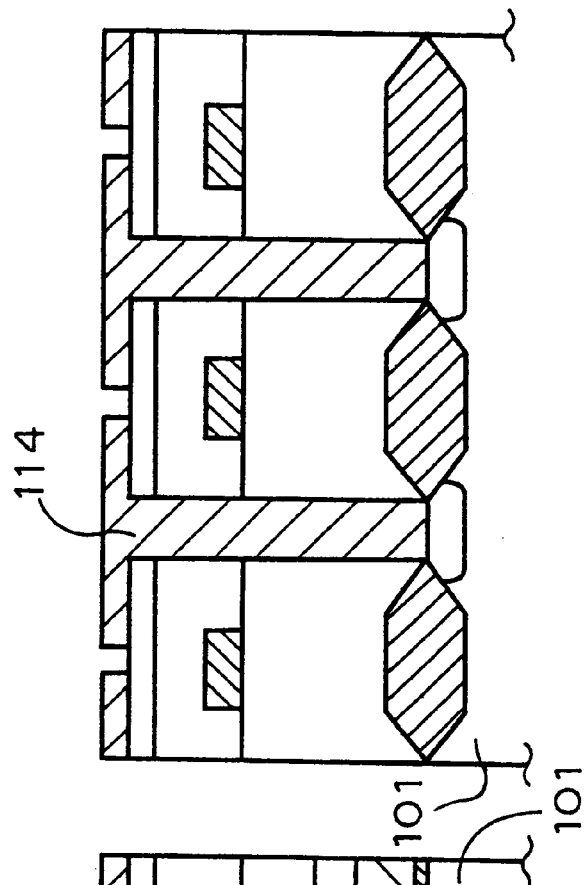
FIGS. 24(a)–24(b) illustrates a method for manufacturing a memory cell in the prior art.
Figure 24B:
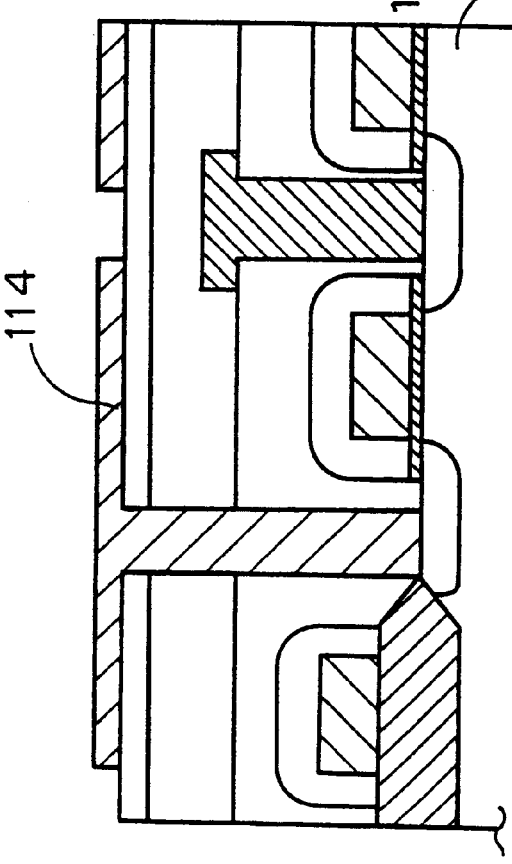
Figure 25A:
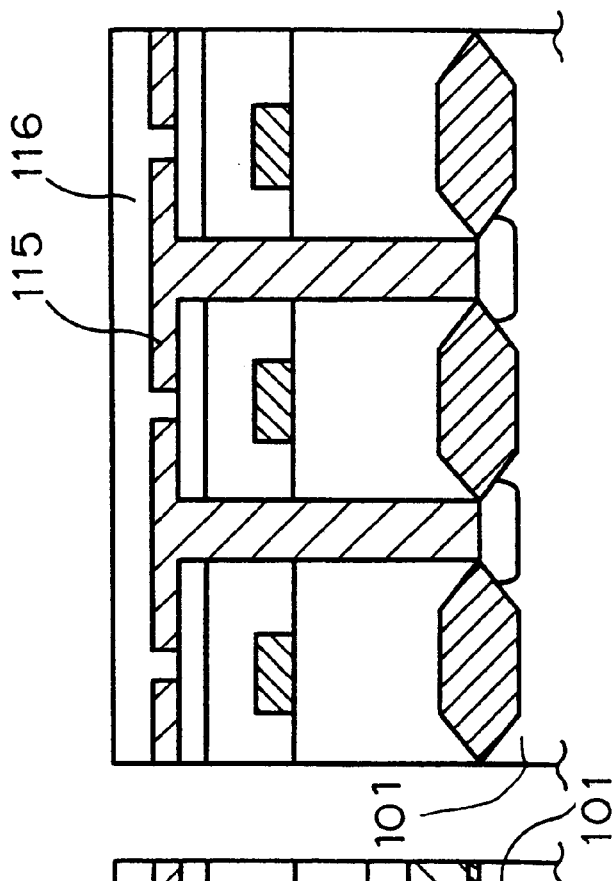
FIGS. 25(a)–25(b) illustrates a method for manufacturing a memory cell in the prior art.
Figure 25B:
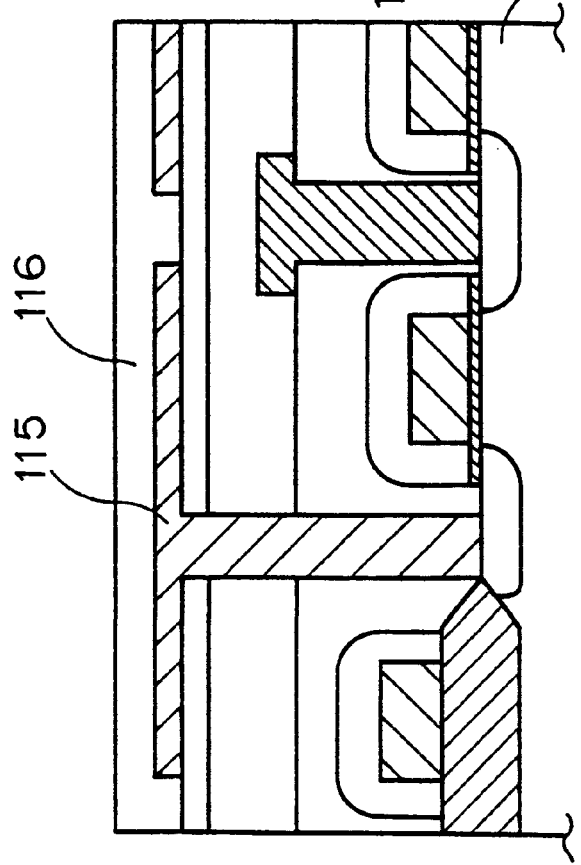

Next, as illustrated in FIG. 16, a second oxide film 51 containing phosphorus and boron is grown to a thickness of 3000–8000 angstrom through CVD, and after performing a reflow in a nitrogen atmosphere at a temperature of 800–1000 degrees centigrade, an oxide film 52 is grown to a thickness of approximately 1000 angstrom through the LP-CVD method. This oxide film 52 is required in order to thinly form a capacitor insulating film 55 which is to be formed in a subsequent step that is to be detailed later to ensure a sufficient capacitor capacity. Next, cell contacts 53 are opened through photolithography/etching.

Next, as illustrated in FIG. 17, an electrode material constituted of polysilicon is grown to a thickness of approximately 1000–10000 angstrom through the LP-CVD method, and phosphorus is doped at approximately 1–6 E20 cm$^{-3}$ through ion implantation or thermal diffusion to achieve conductivity. Then, through photolithography/etching, storage electrodes 54 are formed. In the following step, as illustrated in FIG. 18, a nitride film which is to constitute the capacitor insulating film 55 is grown to a thickness of approximately 40–60 angstrom through the LP-CVD method. Following this, an electrode material constituted of polysilicon is formed, impurities are doped at approximately 1–6 E20 cm$^{-3}$ to achieve conductivity and a cell plate electrode 56 is formed through photolithography/etching. Through this process, a memory cell A$_3$ of the semiconductor memory in the third embodiment is manufactured.

In the memory cell A$_3$ manufactured as described above, the field oxide film 42 is formed on the semiconductor substrate 41 to achieve a state in which the memory cell A$_3$ is electrically isolated from the cells adjacent to it. The word lines 44 are provided via the gate oxide film 43. The diffusion layer 47 is present at both sides of each word line 44(transistor) with a bit line 50 connected to the diffusion layer 47 at one side via a bit contact 59. The word lines 44 and the bit lines 50 are electrically isolated from each other by the insulating films 48, 57 and 58. The cross section of the bit lines 50 orthogonal to the direction of their wiring achieves a shape whereby the bit lines 50 are embedded inside the grooves 59 at the oxide film 58. A storage electrode 54 is connected to the diffusion layer 47 at the other side via a cell contact 53. The storage electrode 54 forms a capacity between itself and the cell plate 56 via the thin insulating film 55.

In the semiconductor memory in the third embodiment, since the bit lines 50 are embedded inside the grooves 59 formed at the oxide film 58 and the bit lines 50 are secured to the oxide film 58 as in the first and second embodiments, any movement of the bit lines 50 can be prevented when, for instance, a reflow is performed on the second oxide film 51 in a nitrogen atmosphere at a temperature of 800–1000 degrees centigrade. Furthermore, since the photolithography step can be omitted with the necessity for forming a wiring pattern mask precluded when forming the bit lines 50, the number of manufacturing steps can be reduced compared to the first and second embodiments.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

According to the present invention, since the bit lines are firmly secured to the oxide film, the bit lines do not move even when stress is applied to the side surfaces of the bit lines. With the bit lines secured at an oxide film without fluidity, even if a film having fluidity is provided on the bit lines, the bit lines do not move during a heat treatment implemented during a capacitor formation step and the like, to achieve a high yield.

In addition, according to the present invention, since the thickness of the capacitor insulating film can be reduced, a memory cell having a markedly larger capacitor capacity compared to the prior art can be formed. A specific effect achieved in, for instance, a 64Mb DRAM is as follows: In a 64Mb DRAM having a cell size of 1.52×0.8 $\mu$m$^2$, the size of the storage electrodes is 1.2×0.5 $\mu$m$^2$. With the effective film thickness of the capacitor insulating film at 70 angstrom, the capacity C1 of a memory cell in the prior art is C1=3.9×8.854E–14×2.730E–8/70E–8=1.346E–15(F)= 13.46(fF). Since the film thickness of the capacitor insulating film can be reduced according to the present invention, the capacity C2 of the memory cell according to the present invention with the effective film thickness of its capacitor insulating film at 50 angstrom is C2=3.9×8.854E–14× 2.730E–8/50E–8=1.884E–14(F)=18.8 (fF). Thus, the capacity can be increased by approximately 40% compared to that in the example of the prior art.

The entire disclosure of Japanese Patent Application No. 9-249344 filed on Aug. 29, 1997 including specification, claims, drawings and summary is incorporated herein by reference in its entirety.

What is claimed is:

1. A semiconductor memory comprising:

a memory cell formed at a surface of a semiconductor substrate, a groove formed in an oxide film laminated on said semiconductor substrate; and a bit line formed of one material, provided to connect to said goove, said groove extending along a direction of wiring of said bit line for implementing input/output of data for said memory cell, wherein the bit line has a cross-section in a shape of an <I> orthogonal to the direction of wiring.

2. A semiconductor memory according to claim 1, wherein:

said bit line has a cross-section orthogonal to the direction of wiring which is identical to a cross-section of said groove.

3. A semiconductor memory device according to claim 1, wherein a lower portion of said bit line resides in said groove and an upper portion of said bit line resides outside of said groove.

4. A semiconductor memory device according to claim 1, wherein the oxide film is a first oxide film, and the semiconductor memory device further comprises a second oxide film deposited on said bit line and having a etching greater fluidity than the first oxide film.

* * * * *